(12) United States Patent
Bakker et al.

(10) Patent No.: US 7,026,629 B2
(45) Date of Patent: Apr. 11, 2006

(54) LITHOGRAPHIC APPARATUS AND DEVICE MANUFACTURING METHOD

(75) Inventors: Leon Bakker, Helmond (NL); Jeroen Jonkers, Aachen (DE); Hugo Matthieu Visser, Utrecht (NL)

(73) Assignee: ASML Netherlands B.V., Veldhoven (NL)

( * ) Notice: Subject to any disclaimer, the term of this patent is extended or adjusted under 35 U.S.C. 154(b) by 124 days.

(21) Appl. No.: 10/328,174

(22) Filed: Dec. 26, 2002

(65) Prior Publication Data

US 2003/0142280 A1 Jul. 31, 2003

(30) Foreign Application Priority Data

Dec. 28, 2001 (EP) .................................. 01310947

(51) Int. Cl.
*H01J 35/00* (2006.01)
(52) U.S. Cl. .............................. 250/423 P; 250/492.22; 250/504 R; 250/365; 250/461.1
(58) Field of Classification Search ............. 250/492.1, 250/492.3, 493.1, 423 F, 423 P, 424
See application file for complete search history.

(56) References Cited

U.S. PATENT DOCUMENTS

2001/0006217 A1* 7/2001 Bisschops ................ 250/493.1

FOREIGN PATENT DOCUMENTS

| EP | 1 150 169 A2 | 10/2001 |
|---|---|---|
| WO | WO01/49086 | 7/2001 |
| WO | WO01/95362 | 12/2001 |
| WO | WO 02/31932 A1 | 4/2002 |

* cited by examiner

*Primary Examiner*—Nikita Wells
*Assistant Examiner*—David A. Vanore
(74) *Attorney, Agent, or Firm*—Pillsbury Winthrop Shaw Pittman, LLP

(57) ABSTRACT

A lithographic apparatus includes a first space containing a plasma source and also containing a source gas which may have a high absorption of radiation at the wavelength of the projection beam of the apparatus, this gas being restricted from entering the remainder of the lithographic system by a second space containing a buffer gas having a low absorption at the wavelength of the projection beam of the apparatus. The pressure of the buffer gas is lower than or equal to that of the source gas.

20 Claims, 2 Drawing Sheets

LITHOGRAPHIC APPARATUS AND DEVICE MANUFACTURING METHOD

BACKGROUND OF THE INVENTION

This application claims priority to European Application 01310947.5, filed Dec. 28, 2001, the entire contents of which are herein incorporated by reference.

1. Field of the Invention

The present invention relates to a lithographic projection apparatus and device manufacturing method.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT publications WO 98/38597 and WO 98/33096. In the case of a programmable mirror array, the support may be embodied as a frame or table, for example, which may be fixed or movable as required.

Another example of a patterning device is a programmable LCD array. An example of such a construction is given in U.S. Pat. No. 5,229,872. As above, the support in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (IC's). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. In a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. Nos. 5,969,441 and 6,262,796.

In a lithographic apparatus the size of features that can be imaged onto the substrate is limited by the wavelength of the projection radiation. To produce integrated circuits with a higher density of devices, and hence higher operating speeds, it is desirable to be able to image smaller features. While most current lithographic projection apparatus employ ultraviolet light generated by mercury lamps or excimer lasers, it has been proposed to use shorter wavelength radiation of around 13 nm. Such radiation is termed extreme ultraviolet (EUV) or soft x-ray and possible sources include, for instance, laser-produced plasma sources, discharge plasma sources, or synchrotron radiation from electron storage rings.

In a typical discharge plasma source, a plasma is formed by an electrical discharge. The plasma may then be caused to compress so that it becomes highly ionized and reaches a very high temperature, causing the emission of EUV radiation. The material used to produce the EUV radiation is typically xenon or lithium vapor, although other gases such as krypton or tin or water vapor may also be used. However, these gases may have a relatively high absorption of radiation within the EUV range or be damaging to optics further downstream of the projection beam and their presence must therefore be minimized in the remainder of the lithographic apparatus. A discharge plasma source is disclosed, for instance, in U.S. Pat. Nos. 5,023,897 and U.S. Pat. No. 5,504,795.

In a laser-produced plasma source a jet of, for instance, clustered xenon may be ejected from a nozzle. At some distance from the nozzle, the jet is irradiated with a laser pulse of a suitable wavelength for creating a plasma that subsequently will irradiate EUV radiation. Other materials, such as water droplets, ice particles, lithium or tin vapor, etc. may also be ejected from a nozzle and be used for EUV generation. In an alternative laser-produced plasma source an extended solid or liquid material is irradiated to create a plasma for EUV radiation. Laser-produced plasma sources are, for instance, disclosed in U.S. Pat. Nos. 5,459,771, 4,872,189 and 5,577,092.

A common feature of the above sources is that their operation induces a background pressure of some source gas or gases (also including vapors) in or near the source region. Source gasses comprise those gasses or vapors of which a plasma is to be created for EUV generation, but also gases or vapors produced during source operation by, for instance, laser irradiation of a solid or liquid material. The source gases should be confined to the source region since they may be a cause of substantial absorption of EUV radiation or be a cause of contamination and damage in the remainder of the lithographic apparatus.

Systems employing projection radiation having a higher wavelength than EUV radiation typically separate gases present in the source from the remainder of the system using transparent windows. These windows block the movement of the gases from the source but allow the projection beam to pass through. However, no material has yet been proposed which is sufficiently transparent to EUV radiation to allow the use of transparent windows with EUV projection beams. An alternative system, which has been used to contain gases within the source area of an EUV apparatus, is an argon counterflow. An example of this type of system is described in U.S. Pat. No. 5,023,897. In apparatus of this type, argon is pumped into the source in a direction which is counter to the direction of the radiation beam. This system attempts to drive the gases in the source away from the evacuated parts of the lithographic apparatus. However, this system may generate turbulence within the source, which causes problems to the operation of the apparatus. Further, the contamination of the gas present in the source by argon can be problematic. Xenon, a typical gas for use in a plasma source, is expensive and is therefore preferably recycled. However, it is difficult to regenerate xenon from a mixture of gases. Xenon's contamination with argon in such a counterflow device therefore significantly adds to the cost of the recycling step.

SUMMARY OF THE INVENTION

It is an aspect of the present invention to provide a lithographic apparatus which is suitable for use with a discharge or laser-produced plasma source of extreme ultraviolet radiation and which restricts the gases in or near the source from entering further parts of the apparatus.

This and other aspects according to the invention are achieved in a lithographic apparatus including a radiation system constructed and arranged to supply a beam of radiation; a support constructed and arranged to support a patterning device, the patterning device constructed and arranged to pattern the radiation beam according to a desired pattern; a substrate table constructed and arranged to hold a substrate; and a projection system constructed and arranged to project the patterned beam onto a target portion of the substrate; a plasma source constructed and arranged to produce extreme ultraviolet radiation, wherein the plasma source is a part of the radiation system; a first space containing the plasma source and a source gas from the plasma source; and a second space separated from the first space by a wall containing a beam aperture, the second space containing a buffer gas which is different from the source gas, wherein the pressure in the second space is less than or approximately equal to the pressure in the first space and wherein the radiation beam passes through the first and second spaces.

The presence of the buffer gas in the second space impedes the movement of the source gas into the second space. Furthermore, any source gas entering the second space may be effectively pumped away together with buffer gas that is typically continuously refreshed. Thus, the apparatus of the present invention enables the gases from a plasma source to be substantially contained within a particular space and to be restricted from entering the remainder of the apparatus. The transmission of the radiation beam through the apparatus may thus be increased and any contamination or damage to optics further downstream may be prevented. The invention does not require the use of a transparent window or counterflow system and thus avoids the problems associated with the prior art methods described above. In particular, movement of buffer gas into the space containing the source is prevented. Therefore, the gases used in the source remain substantially pure and can be regenerated for re-use relatively cheaply.

According to a further aspect of the invention there is provided a device manufacturing method including projecting a patterned beam of radiation onto a target portion of a layer of radiation-sensitive material; using a plasma source to provide the beam, wherein the beam comprises extreme ultraviolet radiation; providing a first space containing the plasma source and additionally containing a source gas from the plasma source; and providing a buffer gas, which is different from the source gas, to a second space, such that the pressure in the second space is less than or approximately equal to the pressure in the first space; wherein the second space is separated from the first space by a wall containing a beam aperture; and wherein the beam passes through the first and second spaces.

Although specific reference may be made in this text to the use of the apparatus according to the invention in the manufacture of IC's, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and extreme ultra-violet (EUV) radiation (e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Figure 1:
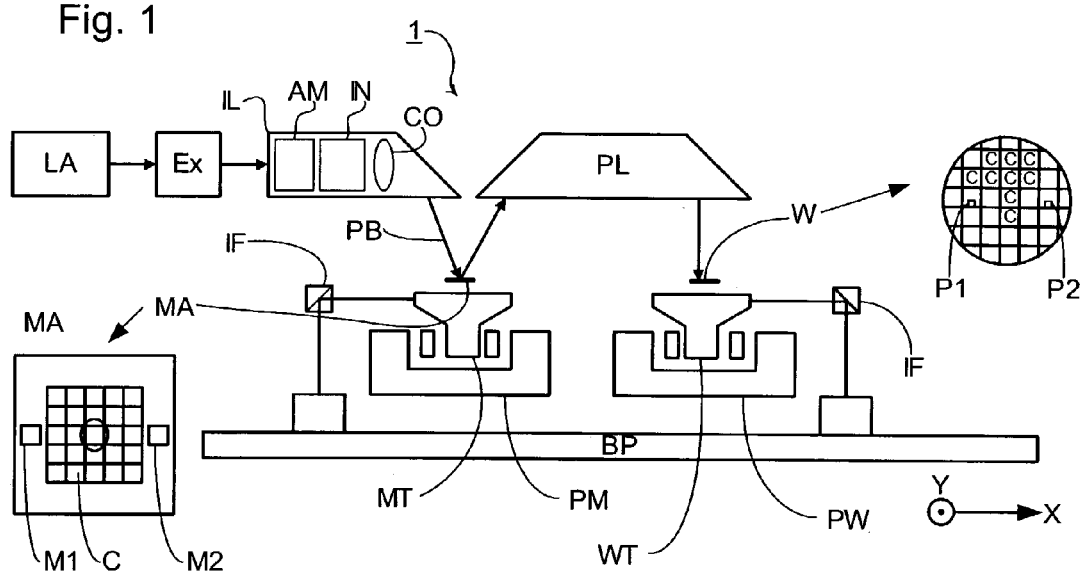
FIG. 1 depicts a lithographic projection apparatus according to an embodiment of the invention.

FIG. 1 schematically depicts a lithographic projection apparatus 1 according to an embodiment of the invention. The apparatus 1 includes a base plate BP; a radiation system Ex, IL constructed and arranged to supply a beam PB of radiation (e.g. EUV radiation), which in this particular case also comprises a radiation source LA; a first object (mask) table MT provided with a mask holder constructed and arranged to hold a mask MA (e.g. a reticle), and connected to a first positioning device PM that accurately positions the mask with respect to a projection system or lens PL; a second object (substrate) table WT provided with a substrate holder constructed and arranged to hold a substrate W (e.g. a resist-coated silicon wafer), and connected to a second positioning device PW that accurately positions the substrate with respect to the projection system PL. The projection system or lens PL (e.g. a mirror group) is constructed and arranged to image an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example with a transmissive mask. Alternatively, the apparatus may employ another kind of patterning device, such as a programmable mirror array of a type as referred to above.

The source LA (e.g. a discharge or laser-produced plasma source) produces a radiation. This radiation is fed into an illumination system (illuminator) IL, either directly or after having traversed a conditioning device, such as a beam expander Ex, for example. The illuminator IL may comprise an adjusting device AM that sets the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus, as is often the case when the source LA is a mercury lamp, for example, but that it may also be remote from the lithographic projection apparatus, the radiation beam which it produces being led into the apparatus (e.g. with the aid of suitable directing mirrors). This latter scenario is often the case when the source LA is an excimer laser. The present invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW and interferometer IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:

1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;

2. In scan mode, essentially the same scenario applies, except that a given target portion C is not exposed in a single "flash." Instead, the mask table MT is movable in a given direction (the so-called "scan direction", e.g., the Y direction) with a speed v, so that the beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
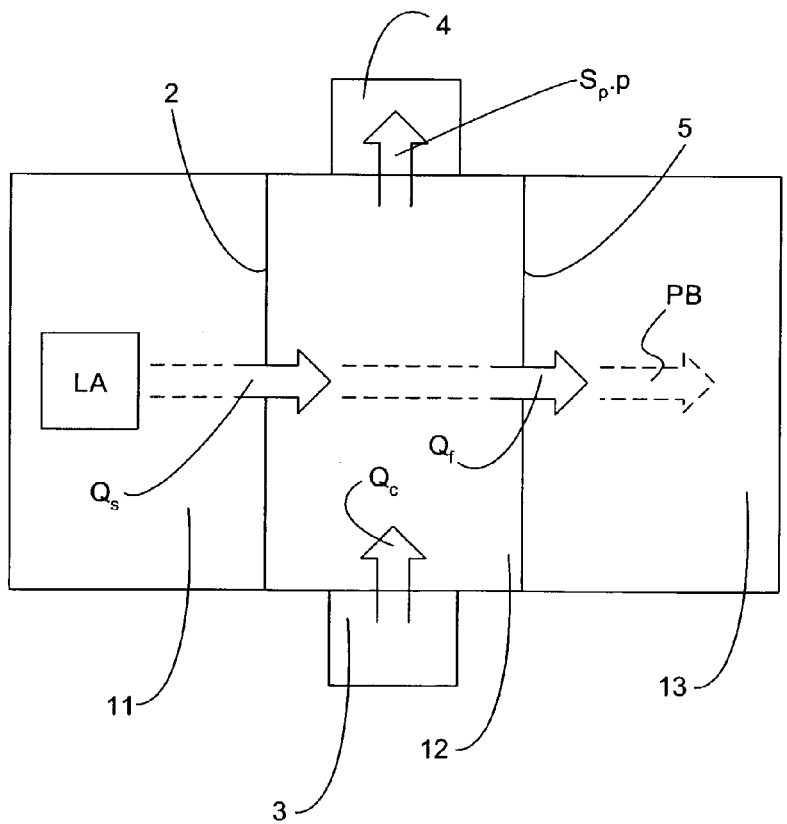
FIG. 2 schematically depicts an embodiment of the invention.

An embodiment of the present invention is depicted schematically in FIG. 2. In this embodiment, the source LA, which is a plasma source for producing extreme ultraviolet radiation (e.g. having a wavelength in the range of from 5 to 20 nm, especially from 9 to 16 nm) is contained within a first space, or source zone 11. The source LA is preferably a discharge or laser-produced plasma source for producing EUV radiation. Any such plasma source may be used in combination with the present invention, for example the discharge plasma sources described in European Patent Applications EP 01305671.8 and EP 00311177.0 and those disclosed in the U.S. Patents discussed above.

Figure 3:
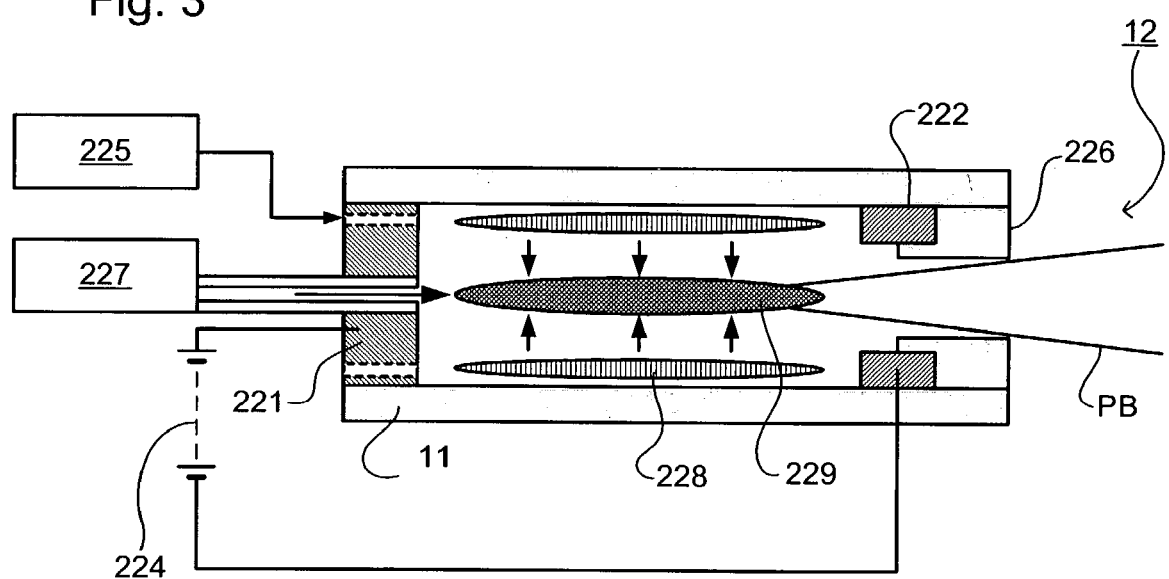
FIG. 3 depicts an extreme ultra-violet radiation source which is suitable for use with the present invention.

The source zone 11 is separated from a second space, or buffer zone 12, for example, by a wall 2, which contains an orifice through which EUV radiation can pass and gases can escape. The beam PB passes from source LA through the orifice and thence through the buffer zone 12. It is particularly preferred that the orifice in the wall 2 separating the source zone 11 and the buffer zone 12 is the source orifice, or is immediately adjacent to the source orifice. An example of a source for use with the present invention is depicted in FIG. 3 and is described further below with reference to FIG. 2.

The source zone 11 contains a source gas, selected for its efficient generation of EUV radiation when brought into a plasma state by laser irradiation or an electrical discharge. Examples of such gases are xenon, krypton, lithium vapor, tin vapor and water vapor. The source gas is desirably prevented or restricted from entering the part of the apparatus through which the beam PB passes, so that transmission of the beam PB through the apparatus can be maximized, or contamination and damage of optics further downstream of the radiation beam PB can be prevented.

The buffer zone 12 contains a buffer gas, which is a gaseous system preferably having a low absorption of radiation at the wavelength of the radiation beam, i.e. a low EUV absorption. Examples of such gases are argon, helium, nitrogen and hydrogen. The buffer gas may contain one or a mixture of these gases.

The pressure of the buffer gas in the buffer zone 12 is chosen to be less than or approximately equal to the pressure of the source gas in the source zone 11. This ensures that substantially no flow of buffer gas into the source zone 11 occurs and that the source gas remains substantially pure. In contrast, a moderate flow or some diffusion of source gas from the source zone 11 to the buffer zone 12 is tolerated so that the buffer zone 12 may contain a mixture of buffer gas and source gas. Where the source zone 11 contains a discharge plasma source, this feature is particularly important since the presence of gases such as argon, nitrogen, helium and hydrogen in the source can be problematic. By adjustment of the pressure and temperature in the buffer zone 12, the gas flow through the source orifice can be controlled. Typically, the pressure of the buffer gas is of the same order of magnitude as the source gas, suitable pressures for both gaseous systems being in the region of 0.1 mbar, for example from 0.05 to 0.15 mbar.

The apparatus may be equipped with a buffer gas supply 3 constructed and arranged to supply buffer gas to the buffer zone 12 and a pump 4 constructed and arranged to remove gas from the buffer zone 12. The pump 4 preferably removes gas in a direction which is substantially perpendicular to the direction of the radiation beam PB. Gas present in the buffer zone 12 can in this way be refreshed. This may be achieved by selective removal of the source gas from the mixture of source gas and buffer gas. For example, a cryopump using a cold-spot at the liquid nitrogen temperature may be used to selectively remove xenon from a mixture of xenon and helium or argon. This is possible since xenon is solid at the boiling point of liquid nitrogen, whilst both helium and argon are gaseous. Generally, all gasses in the buffer zone 12 will be pumped away and fresh buffer gas supplied by supply 3. However, pump 4 may also be dispensed with.

Typically, the buffer zone 12 will be adjacent to a third space, or substantially evacuated zone 13. Typically, the evacuated zone 13 comprises the illumination system or other parts of the apparatus 1 through which the radiation beam PB passes and is evacuated to ensure maximum transmission of the radiation beam PB. A differential pumping system is required in order to retain the vacuum in the evacuated zone 13 while retaining a low pressure of buffer gas in the buffer zone 12.

The movement of gas through the zones 11–13 may be described as follows and is depicted in FIG. 2. The gas is pumped from the buffer zone 12 into the evacuated zone 13 through a restricted opening in wall 5 resulting in gas flow $Q_f$. Pump 4 removes gas from the buffer zone at a rate $S_p$, resulting in a gas outflow $S_p.p$, wherein p is the pressure in the buffer zone 12. Fresh buffer gas is supplied to the buffer zone by the supply 3 causing a gas in-flow $Q_c$. A further movement of gas occurs due to the source gas flowing out of the source zone 11 or, when the source zone 11 and the buffer zone 12 are at approximately equal pressures, diffusing out of the source zone 11. This is defined as gas flow $Q_s$.

The gas flows $Q_f$ and $S_p.p$ both contain a fraction θ of source gas. Flow $Q_s$ is assumed to comprise only source gas. Assuming a constant pressure in the buffer zone 12, the particle balance for the source gas can be defined as follows:

$$Q_s = \theta.S_p p + \theta.Q_f \qquad (1)$$

The expression for the flow through the restricted opening in wall 5 is:

$$Q_{f,Source} = \theta \cdot Q_f = \frac{Q_s}{1 + \frac{S_p p}{Q_f}} \qquad (2)$$

It is clear from this expression that the amount of source gas in the gas flow $Q_f$ decreases with increasing refreshment rate of the buffer gas. Thus, the presence of the buffer gas impedes the source gas from exiting the source zone 11 and substantially reduces the amount of source gas which enters the buffer zone 12 and therefore the remainder of the system.

In one embodiment of the invention, additional source gas is added close to the source orifice in order to restrict the flow of buffer gas into the source zone 11. For example, the source described by Bergmann et al (Appl. Optics 38, 5413 (1999)) may be used to achieve this. The source has a conical orifice, which may be continuously filled and refreshed with source gas. The diffusional flux of buffer gas into the source may thus be reduced to a negligible level. Preferably, the additional flow of source gas caused by this embodiment should be of the same order of magnitude as the diffusional mixing of buffer and source gases at the source orifice.

A second embodiment of the invention is depicted in FIG. 3. A Z-pinch plasma discharge source includes a cylindrical source zone 11. EUV radiation is produced within the source zone 11 and emitted via a source orifice defined by a flange 226, into buffer zone 12 which is the space outside the source zone 11.

In this embodiment, a first source gas 228 is injected into the source zone 11 from a source 225 and pre-ionized in volume 228. This gas is chosen for its ability to generate a high-temperature plasma. A voltage is applied between annular anode 222 and annular cathode 221 from voltage source 224, thus generating a pinch volume 229 at high temperature and pressure. A further source gas, which is chosen for its efficiency in emitting EUV radiation, may be injected into the pinch volume from a source 227. The source gases within the pinch volume 229 are compressed and heated to emit an EUV radiation beam PB which exits the source zone 11 via the orifice into the buffer zone 12.

Buffer gas is supplied to the buffer zone 12 in order to reduce the effect of source gas exiting the source zone 11 through the orifice, as described above with reference to FIG. 2.

EXAMPLE

The following example calculates the fraction of source gas which enters the vacuum system of a lithography apparatus using the buffer system of the present invention.

The apparatus used is that schematically depicted in FIG. 2. The zone 11 is a discharge plasma source, for example that depicted in FIG. 3, containing xenon as the source gas. The source comprises a source orifice defined by a flange, for example a flange 226 as depicted in FIG. 3 or a conical 20 mm thick flange. The buffer zone 12 contains argon at a pressure of 0.1 mbar and a temperature of 400K. The pressure in the source zone 11 is slightly higher than this. The zone 13 is evacuated. The mean free path of xenon atoms in argon is in the order of 1 mm for an argon temperature of 400K. This length, and the size of the source orifice, is small enough to ensure that the mixing of xenon and argon at the source orifice is diffusional.

The gas flow due to diffusional flux can be written as $$Q_s = kT \frac{\pi}{4} d^2 \cdot D_{12} \cdot \frac{\partial n_{Xe}}{\partial x} \approx kT \frac{\pi}{4} d^2 \cdot D_{12} \cdot \frac{\Delta n_{Xe}}{\Delta x} \quad (3)$$

where k is Boltzmann's constant, T is the gas (xenon) temperature, $D_{12}$ is the diffusion coefficient of the xenon-argon mixture, d is the diameter of the source orifice and $n_{Xe}$ is the xenon density. The derivative can be approximated by the difference in the xenon density $n_{Xe}$ over the length of the mean free path. The diffusion coefficient $D_{12}$ for a mixture of xenon and argon at a pressure of 0.1 mbar and a temperature of 400K is $2 \times 10^3$ cm²/s. For the density gradient, we assume the xenon density to decrease to approximately zero over the length equal to the thickness of the source orifice flange. The resulting diffusional 'flow' $Q_s$ through the source orifice is 0.02 mbar.l/s. This flow is almost an order of magnitude lower than the flow through the orifice when the source is directly connected to the vacuum system (which would be 0.23 mbar.l/s). $Q_f$ is assumed to be equal to 10 mbar.l/s and Sp is taken as 100 l/s.

Thus, using expression (2) above, the xenon fraction of the flow $Q_f$ is 0.01 mbar.l/s. The xenon pressure in the buffer zone is $1 \times 10^{-4}$ mbar. For a 7 cm optical path, the EUV transmission will increase from 0.73 to 0.90.

While specific embodiments of the invention have been described above, it will be appreciated that the invention may be practiced otherwise than as described. The description is not intended to limit the invention.

What is claimed is:

1. A lithographic projection apparatus, comprising:
    a radiation system constructed and arranged to provide a beam of radiation;
    a support constructed and arranged to support a patterning device, the patterning device constructed and arranged to pattern the beam according to a desired pattern;
    a substrate table constructed and arranged to hold a substrate;
    a projection system constructed and arranged to project the patterned beam onto a target portion of the substrate;
    a plasma source constructed and arranged to produce extreme ultraviolet radiation, which plasma source is a part of the radiation system;
    a first space containing only the plasma source and a source gas from the plasma source; and
    a second space separated from the first space by a wall containing a beam aperture, the second space containing a buffer gas which is different from the source gas; wherein the pressure in the second space is less than or approximately equal to the pressure in the first space and the beam of radiation passes through the first and second spaces.

2. An apparatus according to claim 1, wherein the source gas comprises xenon, lithium vapor, tin vapor, krypton or water vapor.

3. An apparatus according to claim 1, wherein the buffer gas is one or a mixture of gases selected from argon, nitrogen, helium and hydrogen.

4. An apparatus according to claim 1, further comprising a buffer gas supply constructed and arranged to supply the buffer gas to the second space.

5. An apparatus according to claim 1, further comprising a pump constructed and arranged to remove gas from the second space.

6. An apparatus according to claim 1, wherein the support comprises a mask table constructed and arranged to hold a mask.

7. A device manufacturing method, comprising:
    projecting a beam of radiation after it has been patterned onto a target portion of a layer of radiation-sensitive material at least partially covering a substrate;
    using a plasma source to provide the beam of radiation, wherein the beam of radiation comprises extreme ultraviolet radiation;
    providing a first space containing only the plasma source and a source gas from the plasma source; and
    providing a buffer gas which is different from the source gas to a second space, such that the pressure in the second space is less than or approximately equal to the pressure in the first space; wherein the second space is separated from the first space by a wall containing a beam aperture; and the beam of radiation passes through the first and second spaces.

8. A radiation system constructed and arranged to provide a beam of radiation, comprising:
    a plasma source constructed and arranged to produce a beam of extreme ultraviolet radiation;

a first space containing only the plasma source and a source gas from the plasma source; and a second space separated from the first space by a wall containing a beam aperture, the second space containing a buffer gas which is different from the source gas; wherein the pressure in the second space is less than or approximately equal to the pressure in the first space and wherein the beam passes trough the first and second spaces.

9. A radiation system according to claim 8, wherein the source gas comprises xenon, lithium vapor, tin vapor, krypton or water vapor.

10. A radiation system according to claim 8, wherein the buffer gas is one or a mixture of gases selected from argon, nitrogen, helium and hydrogen.

11. A radiation system according to claim 8, further comprising a buffer gas supply constructed and arranged to supply the buffer gas to the second space.

12. A radiation system according to claim 8, further comprising a pump constructed and arranged to remove gas from the second space.

13. An apparatus according to claim 5, wherein the pump is constructed and arranged to selectively remove source gas from the buffer gas.

14. An apparatus according to claim 1, further comprising an illumination system constructed and arranged to condition the beam of radiation.

15. An apparatus according to claim 1, further comprising a third space separated from the second space by a second wall containing a second beam aperture.

16. An apparatus according to claim 15, wherein the third space is substantially evacuated.

17. An apparatus according to claim 15, wherein the projection system is positioned inside the third space.

18. An apparatus according to claim 15, further comprising an illumination system constructed and arranged to condition the beam of radiation, wherein the illumination system is positioned inside the third space.

19. An apparatus according to claim 1, further comprising a second plasma source.

20. A radiation system according to claim 8, further comprising a second plasma source.

\* \* \* \* \*